United States Patent [19]
Gilbert et al.

[11] Patent Number: 5,453,710
[45] Date of Patent: Sep. 26, 1995

[54] QUASI-PASSIVE SWITCHED-CAPACITOR (SC) DELAY LINE

[75] Inventors: Barrie Gilbert; Shao-Feng Shu, both of Portland, Oreg.

[73] Assignee: Analog Devices, Inc., Norwood, Mass.

[21] Appl. No.: 240,379

[22] Filed: May 10, 1994

[51] Int. Cl.⁶ .................................................. H03H 11/26
[52] U.S. Cl. .......................................... 327/277; 327/278
[58] Field of Search ..................................... 307/246, 353, 307/474, 480, 491, 494, 601, 602, 605, 607; 328/151, 167; 365/194, 222, 122, 149; 327/269–284

[56] References Cited

U.S. PATENT DOCUMENTS

| | | | |
|---|---|---|---|
| 4,366,456 | 12/1982 | Ueno et al. | 333/173 |
| 4,903,241 | 2/1990 | Boudewijns | 365/194 |
| 5,007,022 | 4/1991 | Leigh | 365/189 |
| 5,012,143 | 4/1991 | Boudewijns | 307/606 |
| 5,252,957 | 10/1993 | Itakura | 345/98 |
| 5,313,438 | 5/1994 | Hieda et al. | 365/238 |

OTHER PUBLICATIONS

Switched–Capacitor Frequency–Sampling N–Path Filter, Grunigen et al., 1982 International Symposium on Circuits & Systems, Rome, Italy (10–12 May 1982) IEEE.

Gregorian, Roubik and Temes, Gabor C., *Analog MOS Integrated Circuits for Signal Processing* 1986, Chapter Six, *Nonfiltering Applications of Switched–Capacitor Circuits*, pp. 411–461.

Bult, Klaas, and Wallinga, *IEEE Journal of Solid–State Circuits*, vol. 23, No. 3, Jun. 1988, *A CMOS Analog Continuous–Time Delay Line with Adaptive Delay–Time Control*, pp. 759–766.

Hughes, John B. and Moulding, Kenneth W., *IEEE Journal of Solid–State Circuits*, vol. 28, No. 3, Mar. 1993, *Switched–Current Signal Processing for Video Frequencies and Beyond*, pp. 314–322.

*Primary Examiner*—Timothy P. Callahan
*Assistant Examiner*—Jeffrey Zweizig
*Attorney, Agent, or Firm*—Marger, Johnson, McCollom & Stolowitz

[57] ABSTRACT

A quasi-passive switched capacitor (SC) delay line includes a predetermined number (N) of passive SC delay stages and an amplifier. Each delay stage includes a first transistor having a control terminal for receiving a clock phase, an input terminal for receiving an input signal, and an output terminal, a second transistor having a control terminal for receiving a different clock phase, an input terminal connected to the output terminal of the first switching device, and an output terminal coupled to the amplifier input, and a capacitor coupled between the output terminal of the first transistor and a common supply voltage. The control terminal of each first transistor receives a unique clock phase and the control terminal of the second transistor of the same stage being receives a different clock phase wherein the clock phase received by the second transistor is delayed by two clock cycles from the clock phase received by the first transistor. The resulting quasi-passive SC delay line produces a delay equal to (N–2)×T, where N is equal to the number of delay stages and T is equal to the pulse width of the clock phases.

20 Claims, 3 Drawing Sheets

5,453,710

QUASI-PASSIVE SWITCHED-CAPACITOR (SC) DELAY LINE

BACKGROUND OF THE INVENTION

This invention relates generally to signal processing and more particularly to analog delay lines.

Analog delay lines are important building blocks in many signal processing applications. Both continuous time and discrete time circuits have been used for these delay lines. The discrete delay lines have many advantages over the continuous delay lines in mixed-mode integrated circuit environments. The discreet time delay lines may be implemented in either switch or capacitor (SC) circuits or switch current (SI) circuits.

FIG. 1 shows a commonly used prior are SC delay line with op-amp offset and gain compensation. Each delay stage, which includes one op-amp, one capacitor and three switches, achieves a one-half clock cycle delay. A disadvantage of the design used in FIG. 1 is that it requires op-amps in the intermediate delay stages, which consume both die area and power. Moreover, the achievable sampling speed is limited by the speed of the op-amps.

In many applications where intermediate delayed signals are not needed for output, the op-amps can be removed except for the op-amp stage. The resulting delay lines are commonly referred to as "quasi-passive" SC delay lines. An example of a prior art quasi-passive SC delay line is shown in FIG. 2. An input signal $V_{IN}$ is written into each capacitor sequentially and read out N−1 clock phases later, where N is the total number of delay stages. Another important advantage of this type of circuit over the one shown in FIG. 1 is that the effective sampling rate can be twice the system clock frequency. The increased sampling rate is accomplished by using both the rising and falling edges of the clock. The increased effective sampling rate reduces signal aliasing and the requirements of an anti-aliasing filter (not shown). The effective delay produced by the quasi-passive SC delay line is (N−1)/2×F where F is the system clock frequency.

One disadvantage of this circuit is that it requires even duty cycle, non-overlapping clock phases. The clock phases must be non-overlapping because the transistors in each stage e.g., Q1 and Q2 are controlled by adjacent clock phases. If the adjacent clock phases were to overlap, a virtual short circuit would be formed between the input of the delay line and the input of the amplifier. An example of such even duty cycle, non-overlapping phases is shown in FIG. 3. Clock generator circuits capable of producing the even duty cycle, non-overlapping clock phases shown in FIG. 3 are well known in the art of analog design. The clock circuits, however, are complicated because of the precise tolerances imposed on the clock phases. Accordingly, a need remains for an analog delay line which does not require such exacting tolerances on the clock generator circuit.

SUMMARY OF THE INVENTION

It is, therefore, an object of the invention to provide an analog delay line having relaxed tolerance requirements on the clock phases.

Another object of the invention is to provide a small, inexpensive clock generator circuit that can work in combination with the relaxed tolerance analog delay line.

The invention comprises an improved quasi-passive SC delay line which does not require even duty cycle, non-overlapping clock phases. Instead, the improved quasi-passive SC delay line according to the invention can tolerate as much as one clock phase of overlap with the subsequent clock phase. The invention accomplishes this relaxation of the clock tolerance by separating the clock phases for each delay stage by at least one clock phase. In operation, a capacitor is charged in each of a predetermined number (N) of successive clock phases such that the capacitor is charged to the voltage level of an input signal to be delayed. Each capacitor is discharged N−2 clock phases after the capacitor has been charged wherein each capacitor transmits a discharge signal to an amplifier. The amplifier amplifies the discharge signals to produce an output signal that is delayed relative to the input signal by a predetermined delay time given by the formula:

Delay Time=(N−2)×T, where N is equal to the number of delay stages and T is equal to the period of the clock phases.

The quasi-passive SC delay line includes an amplifier and a plurality of passive SC delay stages. Each delay stage includes a first switching device having a control terminal for receiving a clock phase, an input terminal for receiving the input signal, and an output terminal. Each delay stage also includes a second switching device having a control terminal for receiving a different clock phase, an input terminal connected to the output terminal of the first switching device, and an output terminal coupled to the amplifier input, and a capacitor coupled between the output terminal of the first transistor and a common supply voltage. The control terminal of each first switching device is adapted to receive a first clock phase while the control terminal of the second switching device of the same stage is adapted to receive a clock phase that is delayed by N−2 clock phases from the first clock phase.

The foregoing and other objects, features and advantages of the invention will become more readily apparent from the following detailed description of a preferred embodiment of the invention which proceeds with reference to the accompanying drawings.

DETAILED DESCRIPTION

Figure 4:
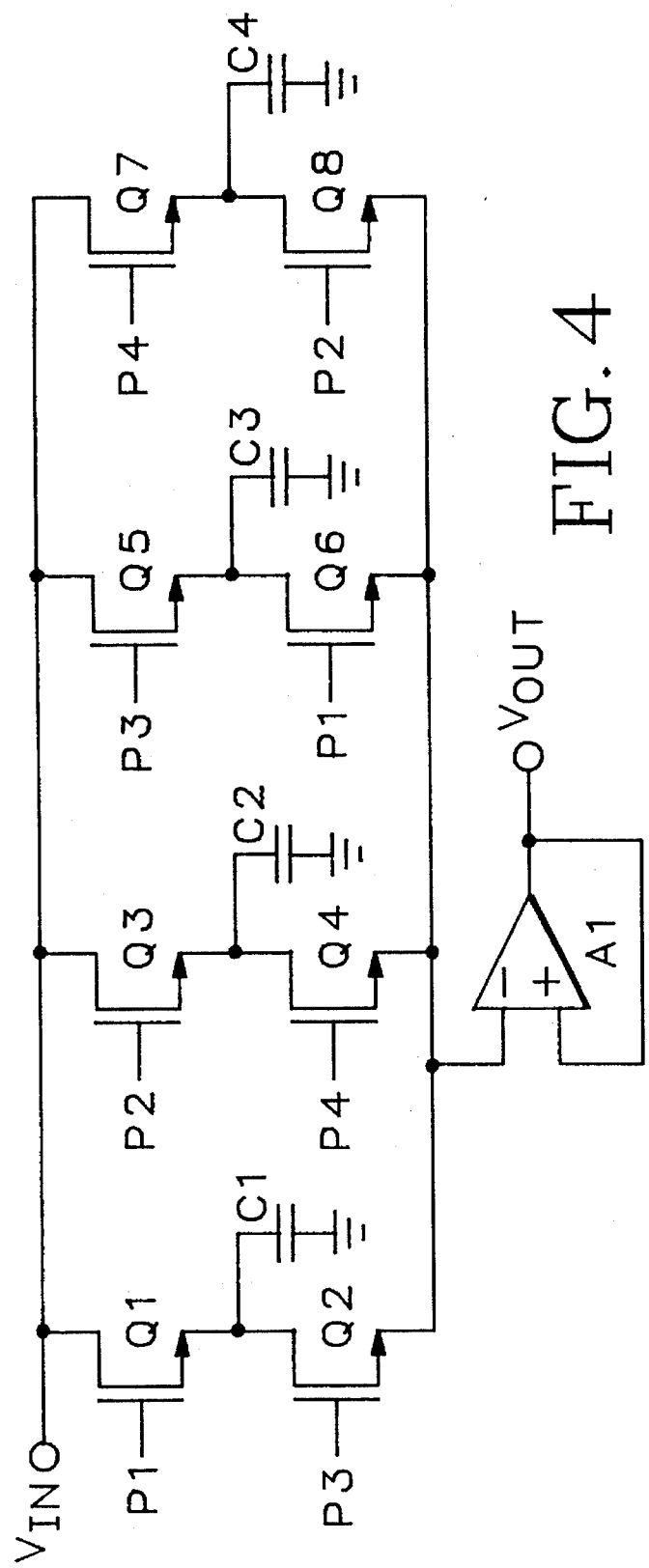
FIG. 4 is a quasi-passive SC delay line operated according to the invention.

Referring now to FIG. 4, a quasi-passive switched capacitor (SC) delay line according to the invention is shown. The delay line includes an operational amplifier A1 configured as a unity gain output amplifier. The delay line also includes a plurality (N) of passive SC delay stages. The delay line of FIG. 4 includes four delay stages. The invention is not limited to any particular number of delay stages. There must be at least three. The actual number of delay stages is determined by the desired delay.

Each delay stage includes a first switching device, a second switching device, and a capacitor. In the preferred embodiment, the switching devices are comprised of metal-oxide-semiconductor (MOS) field-effect-transistors (FETs), however, bipolar-CMOS transistors can be used instead as will be apparent to those skilled in the art. The following description will consider the first delay stage which consists of FETS Q1 and Q2 and capacitor C1. The configuration of the other stages is substantially similar with the exception of the clock phases, which will be described in more detail below.

The drain of Q1 forms an input terminal of the delay line for receiving an input signal $V_{IN}$. The source of Q1 is coupled to the corresponding capacitor C1. The gate of Q1 forms a control terminal for receiving a clock phase P1. The FET Q1 charges up capacitor C1 responsive to the clock phase P1 being asserted; hence, FET Q1 is known herein as a charging transistor. A second FET Q2 is coupled to the capacitor to act as a discharging transistor. The drain of FET Q2 is coupled to capacitor C1 to act as an input terminal for the receiving the charge stored thereon. The source of Q2 is coupled to an input terminal, i.e., the inverting input, of the amplifier A1. The gate of Q2 forms a control terminal for receiving a clock phase P3, which is clock phase P1 delayed by N−2 clock phases, i.e., 2 clock phases.

Each of the other delay stages also includes a charging transistor, a discharging transistor, and a capacitor. The gate of each charging transistor, i.e., Q3, Q5, and Q7, forms a control terminal for receiving a unique clock phase. The gate of each corresponding discharging transistors, i.e., Q4, Q6, and Q8, respectively, forms a control terminal for receiving a clock phase that is delayed by (N−2) clock phases from the clock phase of the corresponding charging transistor. Because the clock phases are periodic and have a frequency of one pulse per N clock pulse, phase P1, for example, is actually two clock phases delayed from clock phase P3.

Figure 5:
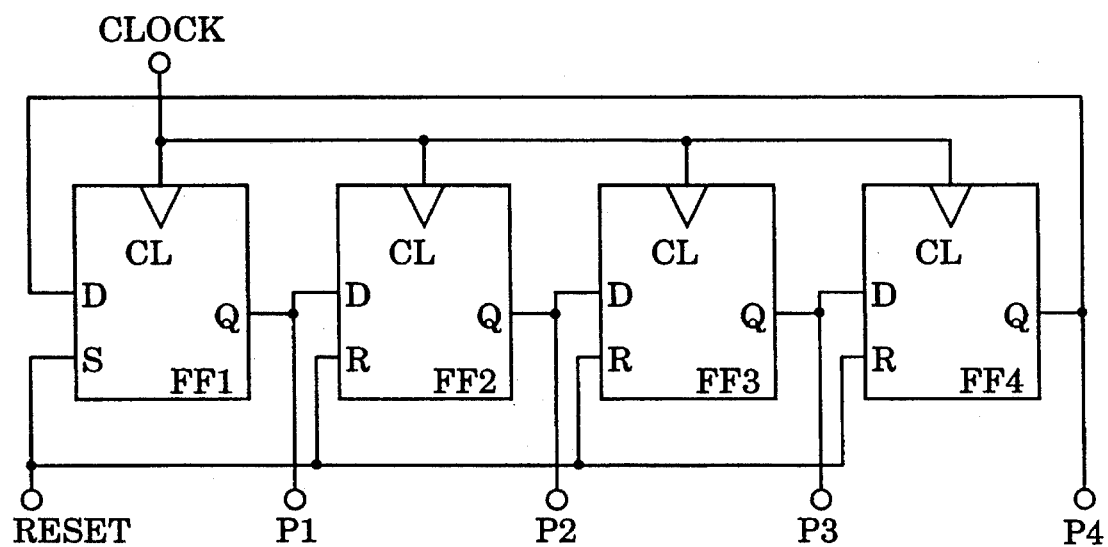
FIG. 5 is a clock generator comprised of a circular shift register for the quasi-passive SC delay line of FIG. 4.

Referring now to FIG. 5, a clock generator circuit is shown which can be used to generate the clock phases P1–P4 for the invention. This clock generator shown is a circular shift register which produces a plurality of corresponding adjacent clock phases P1–P4. The clock generator circuit is representative of the type of low cost, low tolerance clock circuit that can be used with the invention. Other types of clock circuits can be substituted for the one shown in FIG. 5 as will be apparent to those having ordinary skill in the art in view of the principles described hereinafter. The main difference between the clock generator shown in FIG. 5 and that required by the prior art is that the clock generator of FIG. 5 does not necessarily produce non-overlapping clock phases. As will be shown below, however, non-overlapping clock phases are not a requirement of the delay line according to the invention. In fact, the delay line described herein permits an overlap of up to one complete clock phase with the adjacent clock phase.

The shift register includes four D-type flip-flops FF1–FF4 connected in a serial fashion with the Q output of one connected to the D-input of an adjacent flip-flop. The clock inputs of the flip-flops are connected to a clock terminal for receiving a clock signal CLOCK. The first flip-flop FF1 has a set input S connected to a reset terminal for receiving a reset signal RESET, which causes the Q output of FF1 to go to a logic high when the RESET signal is asserted. The remaining flip-flops include reset inputs R connected to the reset terminal for receiving the reset signal RESET, which causes the Q outputs of FF2–FF4 to go to a logic low when the reset signal RESET is asserted.

Figure 1:
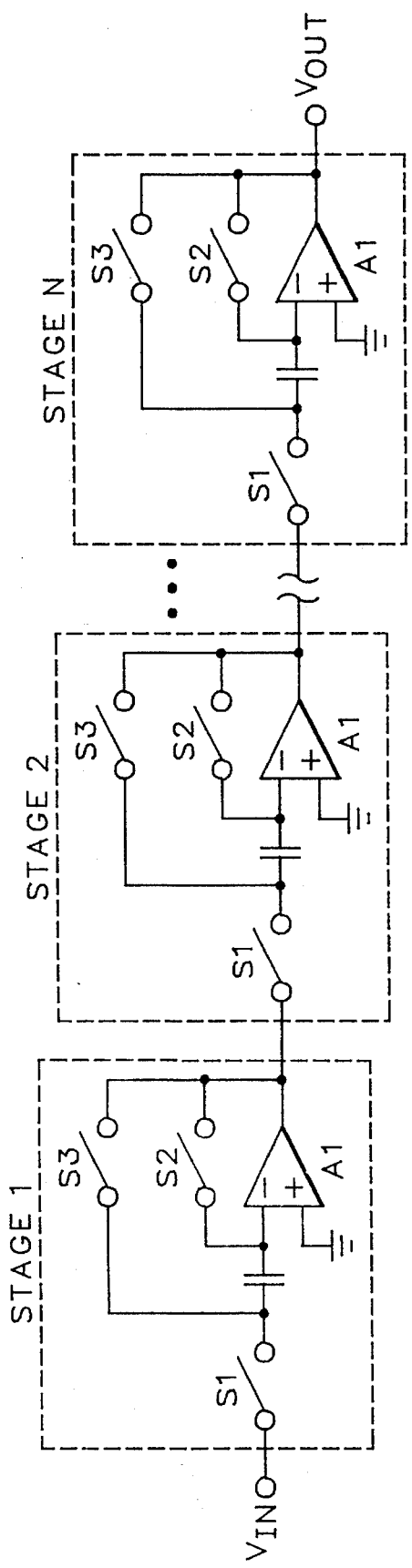
FIG. 1 is a prior art switched-capacitor (SC) delay line with op-amp offset and gain compensation.
Figure 3:
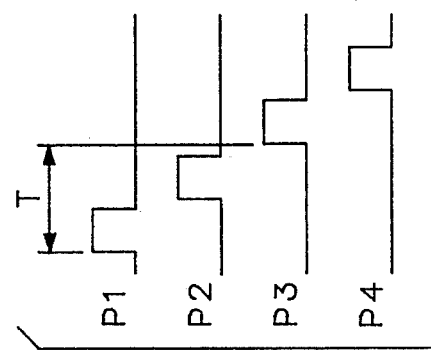
FIG. 3 is a timing diagram of a plurality of even duty cycle, non-overlapping clock phases used to control the delay line of FIG. 2 in accordance with a prior art method.
Figure 2:
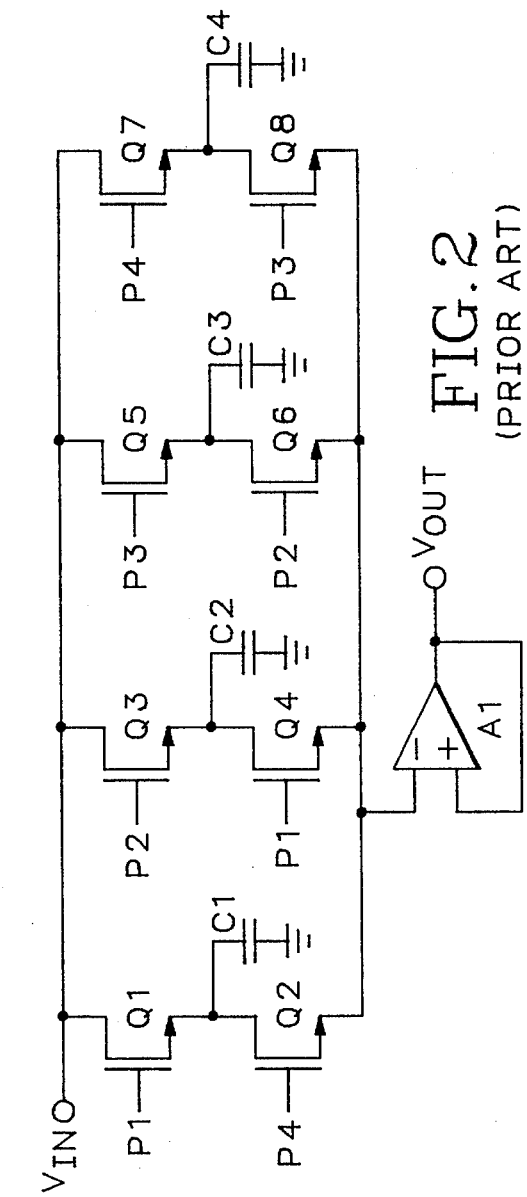
FIG. 2 is a prior art quasi-passive SC delay line.
Figure 6:
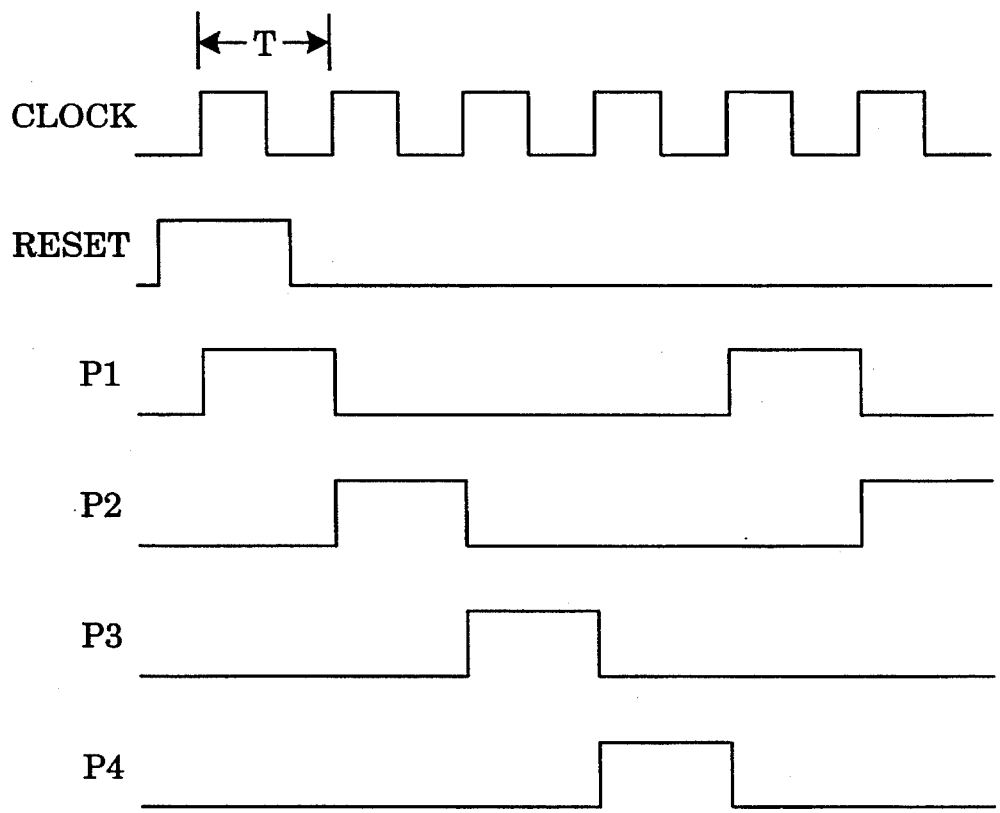
FIG. 6 is a timing diagram of a plurality of clock phases generated by the clock generator of FIG. 5.

The clock generator circuit produces clock phases P1–P4 shown in FIG. 6. These clock phases are coupled to the corresponding control terminals of the transistors of the quasi-passive switched capacitor (SC) delay line shown in FIG. 4. Although the clock phases P1–P4 are shown as substantially even duty cycle and non-overlapping, this is not required by the invention. In fact, the circuit shown can produce overlapping clock phases, which would cause a short circuit in the prior art delay line shown in FIG. 2. This overlap could occur if the rising edge of one clock phase, e.g., P2, occurred prior to the trailing edge of the prior clock phase, e.g., P1. This overlap would not cause a problem for the delay line according to the invention. In fact, the delay line according to the invention can tolerate clock overlap of up to one complete clock cycle with the subsequent clock phase without causing a short to form within the delay stage. For example, clock phase P3 could almost completely overlap clock phase P4 without causing a short in the first delay stage, as long as the trailing edge of P3 did not overlap the leading edge of P1. As a result of this, the tolerance imposed on the clock generator can be much looser than in the prior art, which requires the clock phases to be non-overlapping.

The operation of the quasi-passive switched capacitor (SC) delay line can be considered either as a charge and discharge circuit or as a sample and hold circuit. As a charge and discharge circuit, a unique capacitor is charged in each of N successive clock phases, where N is equal to the number of stages of the delay line. During each phase, the corresponding capacitor is charged to the voltage level of the input signal at that particular point in time. The charge on the capacitor is held for N−2 clock phases. After N−2 clock phases, each capacitor is discharged in successive phases to the output amplifier A1. During the discharge step, each capacitor transmits a discharge signal to the amplifier, i.e., the signal stored on the capacitor, to the amplifier. The amplifier amplifies the discharge signals to produce an output signal that is delayed relative to the input signal by a predetermined delay time. The above-described steps are repeated every N clock phases. The resulting delay time is given by the formula:

$$\text{Delay Time} = (N-2) \times T,$$

where N is equal to the number of delay stages and T is equal to the pulse width of each clock phase.

The step of charging the capacitor is accomplished by enabling one of the charging transistors in each clock phase. The discharging step is accomplished by enabling the corresponding discharging transistor within the same delay stage by a clock phase that is delayed by N−2 clock phases from the clock phase coupled to the corresponding charging transistor.

Considered another way the quasi-passive switched capacitor (SC) delay line operates as a sample and hold circuit. Seen in this way, the input signal $V_{IN}$ is sampled during each of N successive clock phases. Each sample taken by one of the delay stages. The samples are stored in the capacitor for N−2 clock phases. Thereafter, the stored input signals are transmitted to the output amplifier A1. The amplifier A1 amplifies the transmitted signals such that an output signal is generated that is delayed relative to the input signal. In the preferred embodiment of the delay line, the clock phases are substantially identical. However, as described above the clock phases can have up to one-half of one clock cycle overlap with the adjacent clock phase.

Having described and illustrated the principles of the invention in a preferred embodiment thereof, it should be apparent that the invention can be modified in arrangement and detail without departing from such principles. For example, while a four stage quasi-passive switched capacitor (SC) delay line is shown, it should be apparent that the delay line can be extended to any number of stages to produce the desired delay. Furthermore, the clock generator circuit shown in FIG. 5 is merely representative of the clock circuits that can be used in conjunction with the invention. I claim all modifications and variation coming within the spirit and scope of the following claims.

We claim:

1. A method of delaying an input signal by a predetermined amount of time comprising:

providing a predetermined number (N) of capacitors, where N is an integer greater than or equal to four;

charging a unique one of the predetermined, number (N) of capacitors in each of a predetermined number (N) of successive clock phases such that the capacitor is charged to the voltage level of the input signal at the corresponding clock phase;

discharging each capacitor to an output amplifier N–2 clock phases after the capacitor has been charged such that each capacitor transmits a discharge signal to the amplifier; and amplifying the discharge signals to produce an output signal that is delayed relative to the input signal by a predetermined delay time.

2. A method of delaying an input signal according to claim 1 further comprising repeating said charging step after a predetermined number of clock phases.

3. A method of delaying an input signal according to claim 2 further comprising repeating said charging step after N number of clock phases.

4. A method of delaying an input signal according to claim 3 wherein the charging step includes charging a unique capacitor in each of a number (N) of successive clock phases having a predetermined pulse width (T) such that the capacitor is charged to the voltage level of the input signal, wherein the input signal is delayed be a delay time given by:

delay time=(N–2)×T.

5. A method of delaying an input signal according to claim 4 wherein the charging step includes:

interposing a respective charging transistor having a control terminal between the input signal and a corresponding capacitor;

generating a predetermined number (N) of clock phases; and coupling each clock phase to the control terminal of a respective charging transistor.

6. A method of delaying an input signal according to claim 5 wherein the discharging step includes:

interposing a respective discharging transistor having a control terminal between the amplifier and a corresponding capacitor; and coupling one of the clock phases to the control terminal of a respective discharging transistor.

7. A method of delaying an input signal according to claim 6 wherein the step of coupling one of the clock phases to the control terminal of a respective discharging transistor includes coupling a clock phase to the control terminal of a respective discharging transistor that is delayed by N–2 clock phases from the clock phase coupled to the corresponding charging transistor.

8. A method of delaying an input signal by a predetermined amount of time comprising:

providing a predetermined number (N) of capacitors, where N is an integer greater than or equal to four;

sampling the input signal during each of N successive clock phases to produce N signal samples;

storing each signal sample in a respective capacitor for N–2 clock phases;

transmitting each stored input signal to an output amplifier; and amplifying the transmitted signals such that an output signal is generated that is delayed relative to the input signal by a predetermined amount of time.

9. A method according to claim 8 wherein the step of sampling the input signal comprises sampling the input signal in each of a number (N) of successive substantially identical clock phases having a predetermined period.

10. A method according to claim 9 wherein the step of sampling the input signal in each of a number (N) of successive substantially identical clock phases having a predetermined period includes enabling a respective charging transistor during one of the clock phases.

11. A method according to claim 10 wherein the step of storing the sampled signal in a capacitor for N–2 half clock cycles includes storing a number (N) of sampled signals for N–2 half clock cycles.

12. A method according to claim 11 wherein the step of storing a number (N) of sampled signals for N–2 half clock cycles comprises storing each of the number (N) of sampled signals in a corresponding capacitor.

13. A method according to claim 12 wherein the step of transmitting the stored input signal to an output amplifier includes enabling a respective discharging transistor.

14. A quasi-passive switched capacitor (SC) delay line comprising:

a clock generator having a clock input for receiving a clock signal and a plurality (N) of clock outputs for producing a plurality of N corresponding adjacent clock phases, where N is an integer greater than or equal to four, each clock phase having a tolerance which permits up to one clock cycle of overlap with the subsequent clock phase;

an amplifier having an input and an output for producing a delayed input signal; and a plurality (N) of passive SC delay stages, each delay stage including:
   a first switching device having a control terminal for receiving one of said clock phases, an input terminal for receiving an input signal, and an output terminal,
   a second switching device having a control terminal for receiving one of said clock phases, an input terminal connected to the output terminal of the first switching device, and an output terminal coupled to the amplifier input, and
   a capacitor coupled between the output terminal of the first transistor and a common supply voltage,
   the control terminal of each first switching device being connected to a unique clock output for receiving a unique one of said clock phases and the control terminal of the second switching device of the same stage being connected to a different clock output for receiving a different one of said clock phases, the different clock phase being delayed by (N–2) clock phases from the unique clock phase.

15. A quasi-passive switched capacitor (SC) delay line according to claim 14 wherein the clock generator includes a circular shift register.

16. A quasi-passive switched capacitor (SC) delay line according to claim 15 wherein the circular shift register includes a plurality of D flip-flops connected in a serial fashion, each flip-flop having a corresponding clock output for producing a corresponding clock phase having a period of one clock cycle for every plurality (N) clock cycles of the clock signal.

17. A quasi-passive switched capacitor (SC) delay line according to claim 14 wherein the amplifier includes a unity gain amplifier.

18. A quasi-passive switched capacitor (SC) delay line according to claim 17 wherein the amplifier includes an operational amplifier having a non-inverting input terminal, an inverting input terminal, and an output terminal, the output terminal coupled to the noninverting terminal and the inverting terminal connected to the output terminal of each of the second switching devices.

19. A quasi-passive switched capacitor (SC) delay line according to claim 14 wherein the first and second switching devices include field-effect-transistors.

20. A quasi-passive switched capacitor (SC) delay line according to claim 14 wherein the plurality of passive SC delay stages includes at least three passive SC delay stages.

* * * * *